United States Patent
Lee et al.

(10) Patent No.: US 6,853,236 B1
(45) Date of Patent: Feb. 8, 2005

(54) CIRCUIT APPARATUS OPERABLE UNDER HIGH VOLTAGE

(75) Inventors: Chao-Cheng Lee, Hsin Chu (TW); Ming-Cheng Chiang, Hsin Chu (TW)

(73) Assignee: Realtek Semiconductor Corp., Hsin Chu (TW)

(*) Notice: Subject to any disclaimer, the term of this patent is extended or adjusted under 35 U.S.C. 154(b) by 0 days.

(21) Appl. No.: 10/680,241

(22) Filed: Oct. 8, 2003

(30) Foreign Application Priority Data

Dec. 31, 2002 (TW) .......................... 91138197 A

(51) Int. Cl.[7] .............................................. H03K 17/687
(52) U.S. Cl. ..................... 327/436; 327/437; 327/544
(58) Field of Search .................................. 327/427, 434, 327/436, 437, 309, 327–328, 544–546

(56) References Cited

U.S. PATENT DOCUMENTS

| | | | |
|---|---|---|---|
| 3,614,645 A | 10/1971 | Wheatley, Jr. ............... 330/255 |
| 5,696,459 A | 12/1997 | Neugebauer et al. ........ 327/108 |
| 6,040,729 A | 3/2000 | Sanchez et al. ............. 327/309 |
| 6,057,710 A | 5/2000 | Singh ........................... 326/81 |
| 6,222,236 B1 * | 4/2001 | Lamey ........................ 257/355 |
| 6,249,169 B1 | 6/2001 | Okada ......................... 327/333 |
| 6,404,026 B2 * | 6/2002 | Tsuyuki ...................... 257/409 |
| 6,545,926 B2 * | 4/2003 | Ooishi et al. ............ 365/225.7 |
| 6,556,182 B1 * | 4/2003 | Goto et al. .................... 345/98 |

* cited by examiner

*Primary Examiner*—Timothy P. Callahan
*Assistant Examiner*—Cassandra Cox
(74) *Attorney, Agent, or Firm*—Birch, Stewart, Kolasch & Birch, LLP

(57) ABSTRACT

An analog circuit apparatus connected to a high voltage source includes a transistor and an interface unit. The transistor has a low operation voltage smaller than the high voltage source and a breakdown voltage. The interface unit is coupled to the transistor in series for preventing the low operation voltage higher than the breakdown voltage.

18 Claims, 4 Drawing Sheets

CIRCUIT APPARATUS OPERABLE UNDER HIGH VOLTAGE

This nonprovisional application claims priority under 35 U.S.C. § 119(a) on Patent Application No. 091138197 filed TAIWAN on Dec. 31, 2002, which is herein incorporated by reference.

BACKGROUND OF THE INVENTION

1. Field of the Invention

The invention relates to a circuit apparatus, and more particularly to a circuit apparatus having a low-voltage device that is operable under a high voltage source.

2. Description of the Related Art

With the development of the semiconductor manufacturing processes, the density of transistors on a chip or die is getting higher and higher. However, the operation voltage of the chip is getting lower and lower. If a chip, which is manufactured by so-called the 0.13-micron CMOS (Complementary Metal Oxide Semiconductor) process and the operation voltage can be as high as 1.2 volts, operates under the voltage of 3.3 volts, the chip will be damaged in a few seconds due to the 3.3 volts, which is the conventional operation voltage, exceeds the breakdown voltage of the chip formed by the 0.13-micron process. However, several chips are formed on a circuit board, so a commonly specified output amplitude has to be reached in order to communicate data among these chips. As for the digital signal, the usual output amplitude is 3.3 volts. In order to make the output amplitude of the signal reach 3.3 volts, the manufacturer usually provides one or more devices, of which the operation voltage is 3.3 volts, for input/output circuits. The device, which may resist 3.3 volts, has a gate insulation layer having a thickness almost the same as that of a device manufactured using the 0.35-micron CMOS process.

In the aspect of the analog communication, the analog communication protocol is usually provided for the long-distance signal transmitting and receiving. For example, the analog communication protocol may be used for the information interchange between two computers. Since the analog communication protocol is used in the long-distance signal transmitting and receiving, it is necessary to consider that the signal may be influenced and attenuated owing to the wire or cable. Consequently, these communication specifications require a greater output amplitude such as 2 volts. If the advanced process, such as 0.13-micron process, is to be used to manufacture the analog communication circuit, the devices that operate under the voltage of 3.3 volts. Since the device, which can operate at 3.3 volts, has a gate insulation layer having a thickness almost the same as that of a device manufactured using the 0.35-micron CMOS process, its operation speed is much slower than the device that operate at 1.2 volts.

Therefore, the chips usually must have two kinds of devices that may have two different operation voltages, respectively. One kind of the devices may have a low operation voltage and a high operation speed, while the other kind of devices may have a high operation voltage and has a low operation speed. Therefore, it is problematic to design an analog circuit that may have a high operation voltage while having a high operation speed.

SUMMARY OF THE INVENTION

An object of the invention is to provide an analog circuit apparatus having a low-voltage device operable under a high voltage.

Another object of the invention is to provide an analog circuit apparatus that operates at a high speed under the high voltage.

The invention achieves the above-identified objects by providing an analog circuit apparatus to be connected to a high voltage source and including a transistor and an interface unit. The transistor has a low operation voltage lower than the high voltage source and a breakdown voltage. The interface unit is coupled to the transistor in series to prevent the low operation voltage higher than the breakdown voltage.

The interface unit of the above-mentioned analog circuit apparatus may include a resistor and a capacitor connected to the resistor in parallel.

The interface unit of the analog circuit apparatus may include a high-voltage-resistant NMOS transistor having a high operation voltage greater than the low operation voltage, and a gate for receiving a first control signal, which is a low-voltage signal when the analog circuit apparatus is in a power-saving mode.

The interface unit of the analog circuit apparatus may include a high-voltage-resistant PMOS transistor having a high operation voltage greater than the low operation voltage, and a gate for receiving a second control signal, which is a high-voltage signal when the analog circuit apparatus is in a power-saving mode.

The interface unit of the analog circuit apparatus may include a high-voltage-resistant NMOS transistor and a high-voltage-resistant PMOS transistor connected to the NMOS transistor. The NMOS transistor has a high operation voltage greater than the low operation voltage, and a gate for receiving a first control signal, which is a low-voltage signal when the analog circuit apparatus is in a power-saving mode. The PMOS transistor has a high operation voltage greater than the low operation voltage, and a gate for receiving a second control signal, which is a high-voltage signal when the analog circuit apparatus is in a power-saving mode.

According to the above-mentioned configuration, it is possible to operate the low-voltage device under the high voltage source so as to meet the current requirement of the circuit design.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
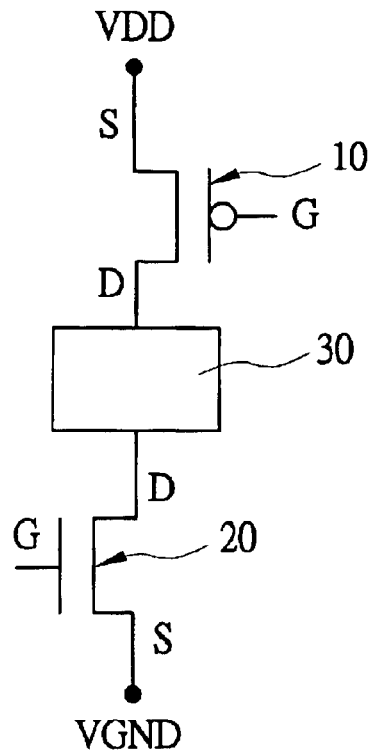
FIG. 1 shows a schematic illustration of an analog circuit apparatus of the invention.

FIG. 1 is a schematic illustration showing a circuit apparatus of the invention. As shown in FIG. 1, the circuit apparatus may be regarded as including a PMOS transistor 10 and an interface unit 30; as including an NMOS transistor 20 and an interface unit 30; or as including a PMOS transistor 10, an NMOS transistor 20, and an interface unit 30. The circuit apparatus including a PMOS transistor 10, an NMOS transistor 20, and an interface unit 30 will be described as an embodiment. At least one of the PMOS transistor 10 and the NMOS transistor 20 has a low operation voltage lower than a high voltage source VDD, and both of the transistors 10 and 20 have their individual functions to achieve their specific objects. For example, the PMOS transistor 10 may have a first breakdown voltage and may operate under a first operation voltage, and the NMOS transistor 20 may have a second breakdown voltage and may operate under a second operation voltage. Avalanche breakdown is caused in the PMOS transistor 10 or the NMOS transistor 20 if the transistor operates under the high voltage source. The interface unit 30 is interposed between the PMOS transistor 10 and the NMOS transistor 20. For example, the PMOS transistor 10 has a source S connected to the high voltage source VDD and a drain D connected to one end of the interface unit 30. The NMOS transistor 20 has a source S connected to a ground voltage VGND and a drain D connected to the other end of the interface unit 30. Thus, the PMOS transistor 10, the interface unit 30 and the NMOS transistor 20 are connected serially. If the high voltage source VDD is individually applied to the PMOS transistor 10 and the NMOS transistor 20, the PMOS transistor 10 and the NMOS transistor 20 are quickly burn out because the high voltage source VDD exceeds the breakdown voltage of each of the PMOS transistor 10 and the NMOS transistor 20. Alternatively, if the drain D of the PMOS transistor 10 is directly connected to the drain D of the NMOS transistor 20, the PMOS transistor 10 and NMOS transistor 20 will also be burn out. By properly designing the interface unit 30, it is possible to make the voltages across the PMOS transistor 10 and the NMOS transistor 20 suitable for the normal operation of the above-mentioned transistors. The configuration of the interface unit 30 will be described hereinafter.

Figure 2:
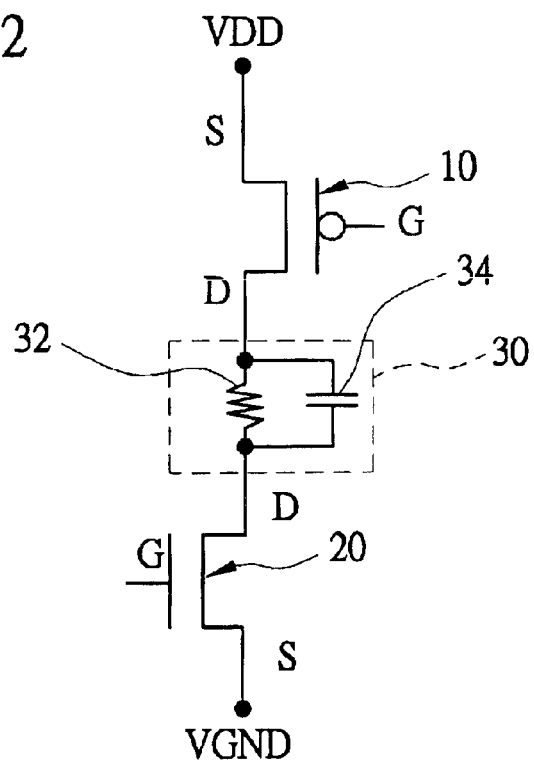
FIG. 2 shows a schematic illustration of a first embodiment of the invention.

FIG. 2 shows a schematic illustration of a first embodiment of the invention. Referring to FIG. 2, the circuit apparatus of this embodiment includes a PMOS transistor 10, an NMOS transistor 20, and an interface unit 30. The interface unit 30 includes a resistor 32 and a capacitor 34 connected to the resistor 32 in parallel. The resistor 32 may share a portion of the voltage difference (VDD-VGND) to define the voltage differences across the PMOS transistor 10 and the NMOS transistor 20, which are low-voltage devices, within the resistant range for the low-voltage devices. That is, the voltage differences across the PMOS transistor 10 and the NMOS transistor 20 are lower than the breakdown voltages of the PMOS transistor 10 and the NMOS transistor 20, respectively. Consequently, the PMOS transistor 10 and the NMOS transistor 20 are free from being burn out. In an analog circuit apparatus that operates normally, the current magnitude of the circuit apparatus is almost determined when the design is made. If the current is I in the original circuit apparatus and the desired sharing voltage difference is V, the resistance may be set as R=V/I.

However, the resistor and the parasitic capacitor in the circuit apparatus cause a pole to delay the signal and slow down the operation speed of the circuit apparatus. Consequently, the capacitor 34 connected to the resistor 32 in parallel is added to cause a zero to offset against the pole so that the operation speed of the circuit apparatus is free from being influenced by the additionally added resistor.

Figure 3:
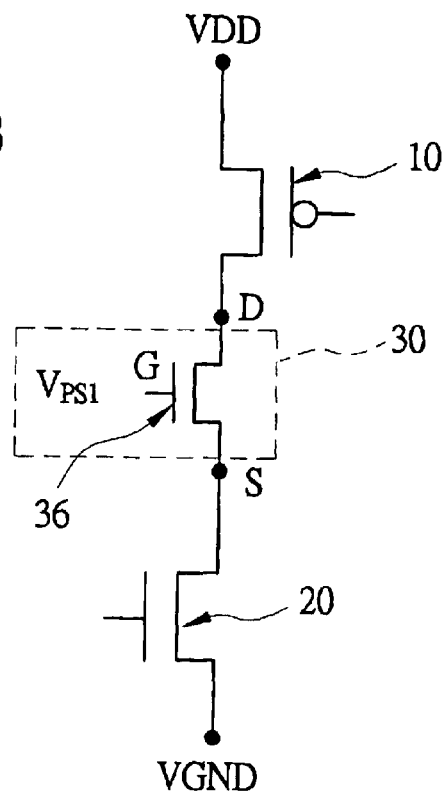
FIG. 3 shows a schematic illustration of a second embodiment of the invention.

FIG. 3 shows a schematic illustration of a second embodiment of the invention. Referring to FIG. 3, the interface unit 30 of this embodiment includes a high-voltage-resistant NMOS transistor 36 having a high operation voltage greater than the low operation voltage, and usually having a third breakdown voltage higher than the first breakdown voltage. Under some design considerations, the NMOS transistor 36 may also has a third breakdown voltage equal to or smaller than the first breakdown voltage. The gate G of the NMOS transistor 36 is coupled to a first control signal $V_{PS1}$ of the power-saving mode, and the first control signal $V_{PS1}$, is a low-voltage signal when the circuit apparatus is in the power-saving mode.

The NMOS transistor 36 may operate in the triode region and the saturation region.

When the NMOS transistor 36 operates in the triode region, it may be regarded as a resistor having a resistance R that may be expressed in the following equation:

$$R \approx \frac{1}{\mu_0 C_{OX}(V_{GS} - V_T)}, \quad (1)$$

wherein $\mu_0$ denotes the electron mobility of the MOS transistor, $C_{OX}$ denotes the gate oxide capacitance, and $V_T$ denotes the threshold voltage.

Under the normal operation, the resistor may cause a voltage difference to share a portion of the voltage difference (VDD-VGND) and make the voltages across the PMOS transistor 10 and the NMOS transistor 20 meet their resistant voltages. The resistance is designed in the same way as the first embodiment.

When the NMOS transistor 36 operates in the saturation region, the low-voltage NMOS transistor 20 coupled to the source S of the NMOS transistor 36 may be regarded as a current source for providing current controlled by the gate voltage in the aspect of the small signal analysis. In this case, the NMOS transistor 36 and the NMOS transistor 20 form a cascode current source, which has an output impedance greater than that of a single NMOS transistor. If the output impedance of the original NMOS transistor 20 equals to ro1, the output impedance of the cascade current source formed by adding the NMOS transistor 36 operating in the saturation region equals to ro1 *(gm2*ro2), wherein gm2 is a small-signal transconductance coefficient of the NMOS transistor 36 and ro2 is an output impedance of the NMOS transistor 36.

In the power-saving mode, the NMOS transistor 36 serves as a switch that is turned off. After it is turned off, all the terminals in the low-voltage NMOS transistor 20, which is coupled to the source S of the NMOS transistor 36, are kept at the ground voltage VGND. On the other hand, all the terminals in the low-voltage PMOS transistor 10, which is coupled to the drain D of the NMOS transistor 36, are kept at the high voltage source VDD. Consequently, the PMOS transistor 10 and the NMOS transistor 20 will not encounter any high voltage problem in the power-saving mode. It is to be noted that the CMOS transistor may be used to replace the NMOS transistor 36.

Figure 4:
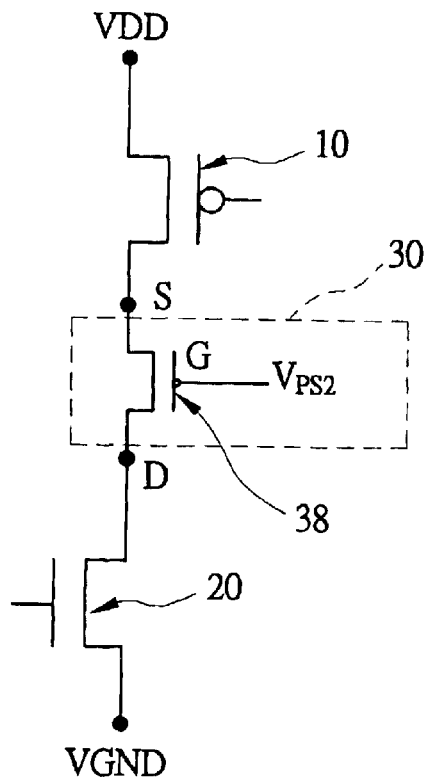
FIG. 4 shows a schematic illustration of a third embodiment of the invention.

FIG. 4 shows a schematic illustration of a third embodiment of the invention. Referring to FIG. 4, the interface unit 30 of this embodiment includes a high-voltage-resistant PMOS transistor 38 having a gate coupled to a second control signal $V_{PS2}$ of the power-saving mode, and the second control signal $V_{PS2}$ is a high-voltage signal when the circuit apparatus is in the power-saving mode.

The PMOS transistor 38 also may operate in the triode region and the saturation region.

When the PMOS transistor 38 operates in the triode region, it may be regarded as a resistor having a resistance that may be expressed by the same Equation (a) as that of the NMOS transistor 36.

Under the normal operation, the principle is the same as that of the second embodiment, and the function of the resistance is the same as that of the first embodiment.

When the PMOS transistor 38 operates in the saturation region, the low-voltage PMOS transistor 10 coupled to the source S of the PMOS transistor 38 may be regarded as a current source for providing current controlled by the gate voltage in the aspect of the small signal analysis. In this case, the PMOS transistor 38 and the PMOS transistor 10 form a cascode current source, which has an output impedance greater than that of a single PMOS transistor. If the output impedance of the original PMOS transistor 10 equals to ro1, the output impedance of the cascade current source formed by adding the PMOS transistor 38 operating in the saturation region equals to ro1*(gm2*ro2), wherein gm2 is a small-signal transconductance coefficient of the PMOS transistor 38 and ro2 is an output impedance of the PMOS transistor 38.

In the power-saving mode, the PMOS transistor 38 serves as a switch that is turned off. After it is turned off, all the terminals in the low-voltage NMOS transistor 20, which is coupled to the drain D of the PMOS transistor 38, are kept at the ground voltage VGND. On the other hand, all the terminals in the low-voltage PMOS transistor 10, which is coupled to the source S of the PMOS transistor 38, are kept at the high voltage source VDD. Consequently, the PMOS transistor 10 and the NMOS transistor 20 will not encounter any high voltage problem in the power-saving mode. It is to be noted that the CMOS transistor may be used to replace the PMOS transistor 38.

Figure 5:
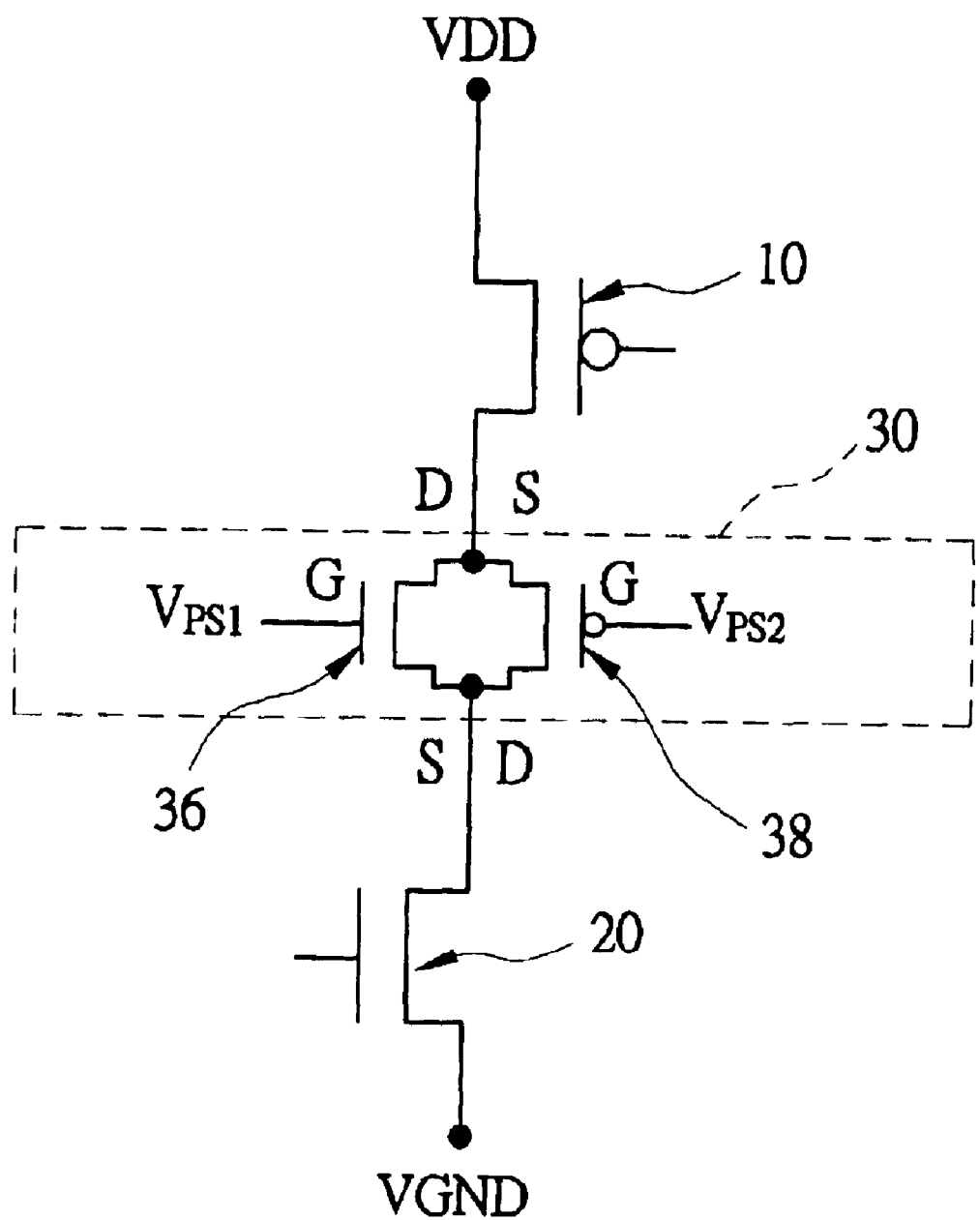
FIG. 5 shows a schematic illustration of a fourth embodiment of the invention.

FIG. 5 shows a schematic illustration of a fourth embodiment of the invention. Referring to FIG. 5, the interface unit 30 of this embodiment includes a high-voltage-resistant NMOS transistor 36, and a high-voltage-resistant PMOS transistor 38 connected to the NMOS transistor 36 in parallel. The NMOS transistor 36 has a gate G coupled to a first control signal $V_{PS1}$ of the power-saving mode, and the first control signal $V_{PS1}$ is a low-voltage signal when the circuit apparatus is in the power-saving mode. The PMOS transistor 38 has a gate G couple to a second control signal $V_{PS2}$ of the power-saving mode, and the second control signal $V_{PS2}$ is a high-voltage signal when the circuit apparatus is in the power-saving mode.

Both the NMOS transistor 36 and the PMOS transistor 38 may operate in the triode region and the saturation region.

When the transistors 36 and 38 operate in the triode region, they may be regarded as a resistor having a resistance R that may be expressed in the following equation:

$$R \approx \frac{1}{\mu_{0N} C_{OXN}(V_{GSN} - V_{TN}) + \mu_{0P} C_{OXP}(V_{GSP} - C_{TP})}, \quad (2)$$

wherein $\mu ON$ denotes the electron mobility of the NMOS transistor, $C_{OXN}$ denotes the gate oxide capacitance of the NMOS transistor, and $V_{TN}$ denotes the threshold voltage of the NMOS transistor; and $\mu_{OP}$ denotes the hole mobility of the PMOS transistor, $C_{OXP}$ denotes the gate oxide capacitance of the PMOS transistor, and $V_{TP}$ denotes the threshold voltage of the PMOS transistor.

Under the normal operation, the principle of the resistor is the same as that of the first embodiment, and detailed description thereof will be omitted.

In the power-saving mode, the NMOS transistor 36 and the PMOS transistor 38 serve as a switch that is turned off. After it is turned off, all the terminals of the low-voltage NMOS transistor 20 are kept at the ground voltage VGND, and all the terminals of the low-voltage PMOS transistor 10 are kept at the high voltage source VDD. Consequently, the PMOS transistor 10 and the NMOS transistor 20 will not encounter any high voltage problem in the power-saving mode.

Figure 6:
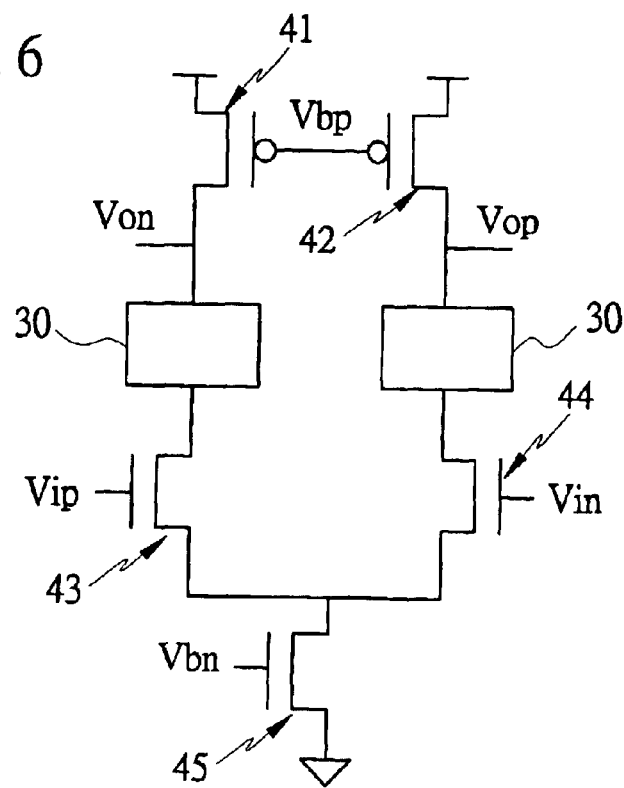
FIG. 6 shows a schematic illustration of a fifth embodiment of the invention.
Figure 7:
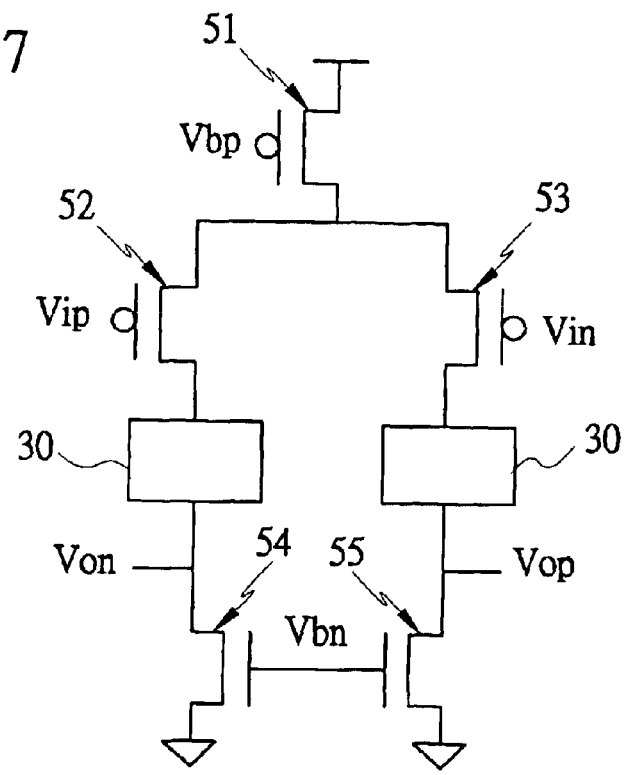
FIG. 7 shows a schematic illustration of a sixth embodiment of the invention.

For example, the interface unit of this invention may be applied to a differential amplifier to operate the differential amplifier at high speed without being bothered by the voltage resistant problem of the low-voltage device. FIGS. 6 and 7 show schematic illustrations of the fifth and sixth embodiments of the invention, respectively. Referring to FIGS. 6 and 7, each of the differential amplifiers equipped with the interface units of the invention includes five MOS transistors 41 to 45(51 to 55) and two interface units 30 disposed as shown in the drawings. Vip and Vin denote the input voltages, and Vop and Von denote the output voltages. Vbn and Vbp denote current control voltages to make the circuit operable in the predetermined current. According to the function of the interface unit 30, it is possible to prevent the low-voltage device from receiving a high voltage. Consequently, in the above-mentioned differential amplifier, the low-voltage MOS transistor may be utilized to achieve the object of high-speed operating.

Although the embodiments are described with reference to the PMOS and NMOS transistors, any transistor meeting the above-mentioned properties may be utilized and is regarded as within the applicable range of the invention.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A circuit apparatus operable under a specified operation voltage, the circuit apparatus comprising:
   a first transistor having a first breakdown voltage and operating under a first operation voltage;
   a second transistor having a second breakdown voltage and operating under a second operation voltage; and
   an interface unit serially coupled to the first transistor and the second transistor for preventing the first operation voltage from being higher than the first breakdown voltage and the second operation voltage from being higher than the second breakdown voltage;
   wherein the specified operation voltage is higher than both the first operation voltage and the second operation voltage.

2. The circuit apparatus according to claim 1, wherein the interface unit comprises:
   a resistor; and
   a capacitor connected to the resistor in parallel.

3. The circuit apparatus according to claim 1, wherein the interface unit is a third transistor having a third breakdown voltage higher than the first breakdown voltage.

4. The circuit apparatus according to claim 3, wherein the third transistor has a gate for receiving a first control signal.

5. The circuit apparatus according to claim 3, wherein the third transistor is an NMOS transistor.

6. The circuit apparatus according to claim 3, wherein the third transistor is a PMOS transistor.

7. The circuit apparatus according to claim 3, wherein the third transistor is a CMOS transistor.

8. The circuit apparatus according to claim 3, wherein the third transistor operates in a triode region or a saturation region.

9. The circuit apparatus according to claim 1, wherein an avalanche breakdown is caused when the first transistor is operating under the specified operation voltage.

10. A circuit apparatus operable under a specified operation voltage, the circuit apparatus comprising:

a first transistor having a first breakdown voltage and operating under a first operation voltage; and an interface unit coupled to the first transistor for preventing the first operation voltage from being higher than the first breakdown voltage;

wherein the specified operation voltage is higher than the first breakdown voltage;

wherein the interface unit comprises a resistor and a capacitor connected to the resistor in parallel.

11. The circuit apparatus according to claim 10, wherein the first transistor is a PMOS transistor.

12. The circuit apparatus according to claim 10, wherein the first transistor is an NMOS transistor.

13. A circuit apparatus operable under a specified operation voltage, the circuit apparatus comprising:

a first transistor having a first breakdown voltage and operating under a first operation voltage; and an interface unit coupled to the first transistor for preventing the first operation voltage from being higher than the first breakdown voltage;

wherein the specified operation voltage is higher than the first breakdown voltage;

wherein the interface unit is a second transistor; and wherein the second transistor operates in a triode region or a saturation region.

14. The circuit apparatus according to claim 13, wherein the second transistor has a second breakdown voltage higher than the first breakdown voltage.

15. The circuit apparatus according to claim 13, wherein the second transistor is an NMOS transistor.

16. The circuit apparatus according to claim 13, wherein the second transistor is a PMOS transistor.

17. The circuit apparatus according to claim 13, wherein the second transistor is a CMOS transistor.

18. A circuit apparatus operable under a specified operation voltage, the circuit apparatus comprising:

a first transistor having a first breakdown voltage and operating under a first operation voltage; and an interface unit coupled to the first transistor for preventing the first operation voltage from being higher than the first breakdown voltage;

wherein the specified operation voltage is higher than the first breakdown voltage;

wherein the interface unit is a second transistor;

wherein the second transistor has a gate for receiving a first control signal to make the circuit apparatus in a power-saving mode.

* * * * *